United States Patent [19]

Trommer

[11] Patent Number: 4,570,094
[45] Date of Patent: Feb. 11, 1986

[54] ROTATING RECTIFIER ASSEMBLY

[75] Inventor: William C. Trommer, Rockford, Ill.

[73] Assignee: Sundstrand Corporation, Rockford, Ill.

[21] Appl. No.: 572,828

[22] Filed: Jan. 23, 1984

[51] Int. Cl.⁴ ............................................. H02K 11/00
[52] U.S. Cl. .................................. 310/68 R; 310/68 D; 310/72
[58] Field of Search ................... 310/68 R, 68 D, 71, 310/72, 168

[56] References Cited

U.S. PATENT DOCUMENTS

| | | | |
|---|---|---|---|
| 3,160,771 | 12/1964 | Martin et al. | 310/68 |
| 3,470,405 | 9/1969 | Andersson et al. | |
| 3,535,567 | 10/1970 | Boyson | |
| 3,629,627 | 12/1971 | Dafler | |
| 3,739,209 | 6/1973 | Drabik | |
| 3,829,725 | 8/1974 | Petersen et al. | |
| 3,838,303 | 9/1974 | Ernst | |
| 3,852,628 | 12/1974 | Spisak et al. | 310/68 D |
| 3,965,379 | 6/1976 | Meusel et al. | |
| 4,048,532 | 9/1977 | Kuter et al. | |
| 4,052,631 | 10/1977 | Kuter | |
| 4,091,229 | 5/1978 | Wooding et al. | |
| 4,161,668 | 7/1979 | Schmohe et al. | |
| 4,169,282 | 9/1979 | Allport et al. | |
| 4,176,242 | 11/1979 | Linscott, Jr. | |
| 4,191,902 | 3/1980 | Yarrow | |
| 4,319,216 | 3/1982 | Ikeda et al. | 310/72 X |
| 4,329,603 | 5/1982 | Ballard | |
| 4,482,827 | 11/1984 | Baldwin | 310/68 D |

Primary Examiner—Donovan F. Duggan
Attorney, Agent, or Firm—Wood, Dalton, Phillips, Mason & Rowe

[57] ABSTRACT

A rotary rectifier assembly including a shaft adapted to be rotated. Three equally angularly spaced phase conductors are disposed about the shaft and insulated with respect to each other and with respect to the shaft and each has opposed, axially opening recesses. Diode wafers are received in each of the recesses and each recess further receives an electrically conductive load shoe. A pair of end conductors sandwich the phase conductors, wafers and load shoes and each end conductor has three equally angularly spaced curved recesses for matingly receiving the curved portion of the corresponding ones of the load shoes. A single biasing device is employed to bias one end conductor towards the other to thereby establish good electrical contact between the various components while occupying a minimum of space and minimizing the overall weight of the assembly.

11 Claims, 4 Drawing Figures

ROTATING RECTIFIER ASSEMBLY

TECHNICAL FIELD

This invention relates to rectifier assemblies, and more specifically, rotating rectifier assemblies such as are used in alternators.

BACKGROUND ART

Various rotary electric machines as, for example, so-called brushless alternators, require the use of rotating rectifier assemblies. In order to avoid the use of brushes, the magnetic field required to induce current is generated by passing a direct current through windings carried by the rotor of the machine. This, in turn, requires that the direct current provided to the rotor field winding be derived from electrical components forming part of the rotor, again to avoid any need for brushes.

Typically, the rotor will carry a series of permanent magnets such that when the rotor is rotated, the magnets will induce an electrical current in a fixed winding forming part of the alternator. These components constitute a conventional permanent magnet generator.

The current induced in the permanent magnet generator is, in turn, rectified and regulated and fed to a so-called exciter. The exciter, in turn, induces an alternating current in a winding, usually a three phase winding, carried by the rotor. The resulting three phase signal is then inputted to a three phase, full wave rectifier which in turn provides the direct current input to the rotor field windings.

In many instances, as, for example, in aircraft generating systems, in addition to the usual reliability concerns, size and weight restrictions are significant. The compactness, or lack thereof, of the rotor will dictate certain bearing and housing size selections and thus affect the weight of the system. And, of course, since the rotating rectifier assembly forms part of the rotor and therefore influences its size, every effort is made to minimize its size and weight.

Prior art of possible relevance includes the following U.S. Pat. No. 3,160,771 issued Dec. 8, 1964 to Martin; U.S. Pat. No. 3,470,405 issued Sept. 30, 1969 to Andersson; and U.S. Pat. No. 4,052,631 issued Oct. 4, 1977 to Kuter. Frequently, the prior art approaches as exemplified by the foregoing may generate axially compact rectifier assemblies but only at the expense of increased radial size. Martin is representative of this downfall.

In other cases, radial compactness is achieved but at the expense of an increase in axial size. Andersson is representative of this downfall. In other cases, such difficulties are compounded by the use of plural clamps for assuring good electrical contact amongst the components of the rectifier assembly and/or proper cooling which may increase both size and weight as, for example, shown in Kuter.

The present invention is directed to overcoming one or more of the above problems.

SUMMARY OF THE INVENTION

It is a principal object of the invention to provide a new and improved rectifier assembly which is ideally suited for, but not limited to, use as a rotating rectifier assembly and which achieves reliable interconnection of the components together with provision for cooling the same in a compact assembly.

According to one aspect of the invention, there is provided a rectifier assembly including a diode wafer receiver of conductive material and having oppositely opening diode receiving recesses, the bottoms of which are adapted to be electrically contacted by a pole of a diode wafer received therein. An electrically conductive load shoe is provided for each of the recesses and each has a first surface adapted to electrically contact the other pole of the diode wafer and an opposite curved surface located at least partially out of the recess.

A pair of end conductors sandwich the diode receiver and the wafers and load shoes associated therewith and each end conductor has a curved surface mating with the curved surface of the adjacent load shoe. Means are provided for biasing the end conductors towards each other to provide a clamping force insuring good electrical contact.

The diode wafers may be disposed in the recesses so as to form a full wave rectifier or, in the alternative, may be arranged to be electrically parallel for increased current capacity.

According to another aspect of the invention, the rectifier assembly includes a shaft adapted to be rotated with three equally angularly spaced phase conductors disposed about the shaft and insulated with respect to each other and with respect to the shaft. The phase conductors have opposed, axially opening recesses in opposite sides thereof and a plurality of diode wafers are provided, one in each of the recesses. Load shoes as mentioned previously are provided for each of the wafers and a pair of end conductors are employed which sandwich the various components. A single means is provided to bias the end conductors towards each other to achieve the requisite clamping force with a minimum of weight in clamping components.

According to still another aspect of the invention, there is provided a rotating rectifier assembly which eliminates the number of terminals required for various connections. The assembly includes an electrically conductive shaft adapted to be rotated and a plurality of diodes disposed about the shaft in insulated relation with respect thereto. Means mount the diodes about the shaft to form a rectifier and include two end conductors sandwiching the diodes. Electrically conductive means in electrical and mechanical contact with one of the end conductors and the shaft are provided for biasing the end conductors towards each other to assure good electrical connections within the rectifier and an electrical load component is carried by the shaft and has one pole in electrical contact with the shaft and another pole in electrical contact with the other of the end conductors thereby eliminating the need for terminals.

Other objects and advantages will become apparent from the following specification taken in connection with the accompanying drawings.

DESCRIPTION OF THE PREFERRED EMBODIMENT

Figure 1:
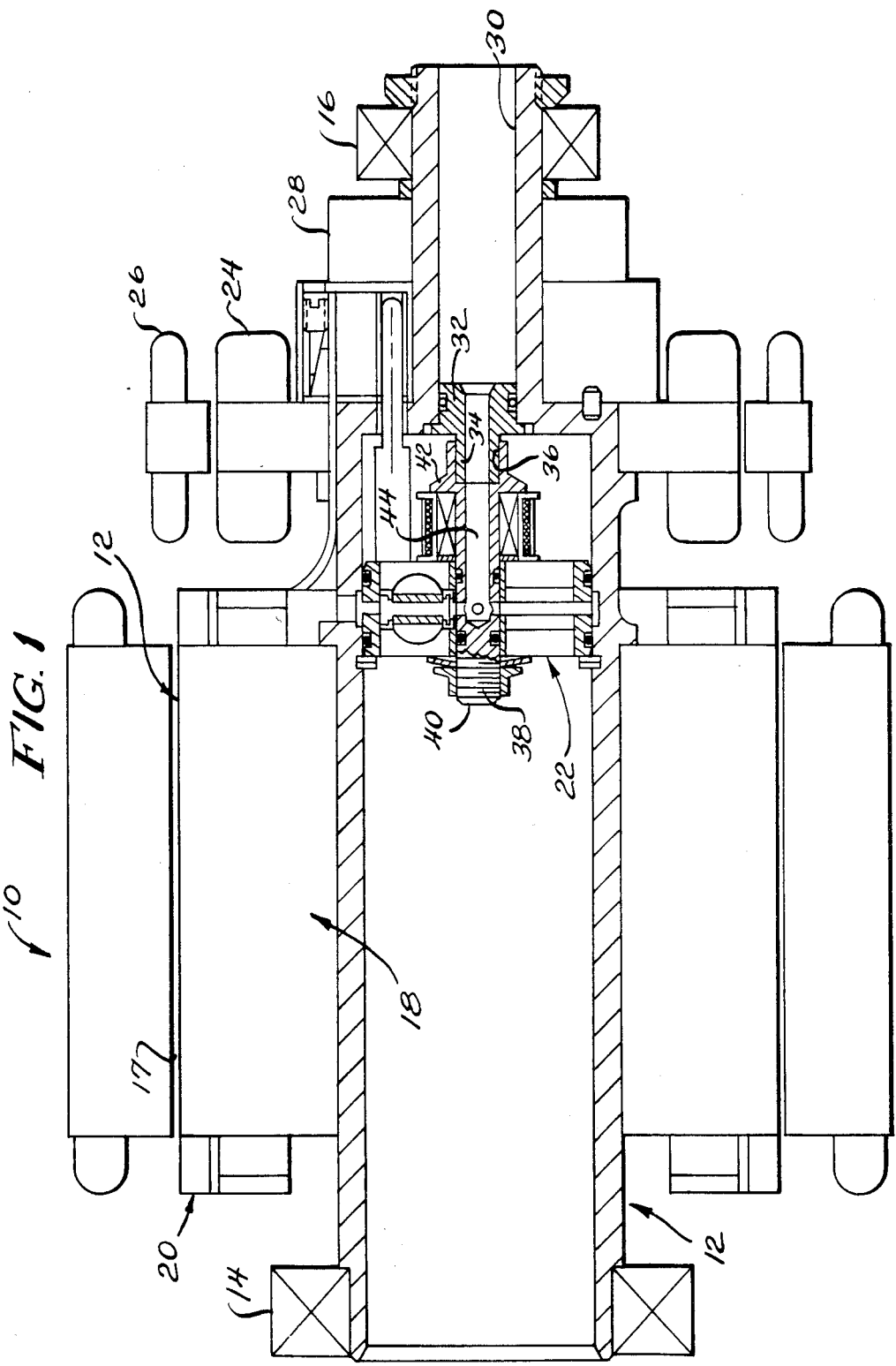
FIG. 1 is a somewhat schematic, partial sectional view of a rotary electric machine embodying a rectifier assembly made according to the invention.

An exemplary embodiment of a brushless rotary electric machine utilizing a recitifier assembly made according to the invention is illustrated in FIG. 1 and is seen to include a stator, generally designated 10 in which electrical current is induced in a customary fashion. A rotor, generally designated 12, is journalled for rotation within the stator 10 by means of bearings 14 and 16. Conventionally, an air gap 17 will separate the rotor 12 from the stator 10.

The rotor 12 includes a main body 18 including a field winding 20. The field winding is energized by direct current from a three phase, full wave rectifier, generally designated 22, carried within the innards of the rotor to one side of the main section 18. A three phase winding 24 is suitably disposed within the rotor 12 and is energized by a conventional exciter rotor 26 located externally of the rotor 12. The exciter 26 is, in turn, provided with electrical current from a field winding of a permanent magnet generator 28 which is, of course, driven by permanent magnets (not shown) carried by the rotor 12.

The rotor 12 includes a hollow end shaft 30 through which a conventional dynamic transfer tube (not shown) may extend to provide cooling and/or lubricating oil to the interior of the rotor 12. To this end, a stepped stub shaft 32 formed of insulating material may be keyed to the interior of the hollow end shaft 30 as seen in FIG. 1. The stub shaft 32 includes a reduced diameter end 34 which in turn is received within an enlarged bore 36 of an electrically conductive shaft 38. The shaft 38 is threaded as at 40 on one end and adjacent the opposite end includes a radially outwardly extending shoulder 42. For a portion of its length, the shaft 38 is hollow as at 44 for receipt of a cooling/lubricating fluid. As can be seen in FIG. 1, the shaft 38 retains the rectifier assembly 22.

Figure 4:
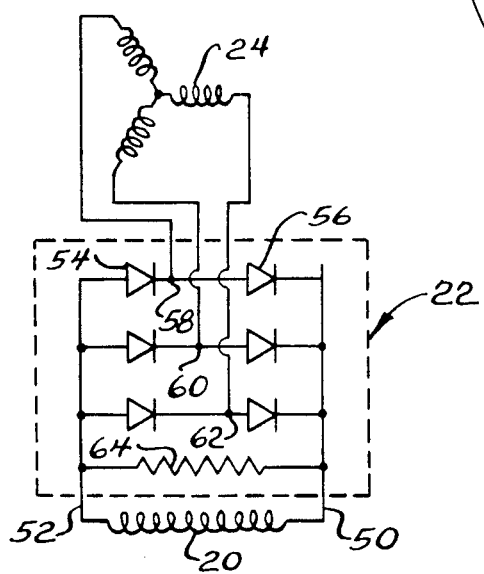
FIG. 4 is an electrical schematic.

Turning now to FIG. 4, the electrical system of the rectifier assembly 22 is illustrated within the dotted line. Output lines for direct current to the rotor field winding 20 are shown at 50 and 52 and the same are interconnected by three electrical branches, each having two diodes 54 and 56 connected in series. To the common junction of the diodes 54 and 56 in each of the branches, one leg of the three phase winding 24 of the exciter is connected. These junctions are shown at 58, 60 and 62.

Finally, a load resistor 64 is connected across the lines 50 and 52 which is, as is well known, for the purpose of dissipating voltage spikes that may be generated as various ones of the diodes 54 and 56 change their conductive state during operation of the generator. It can be appreciated from FIG. 4 that a three phase, full wave rectifier for providing direct current to the rotor field winding 20 is provided.

Figure 2:
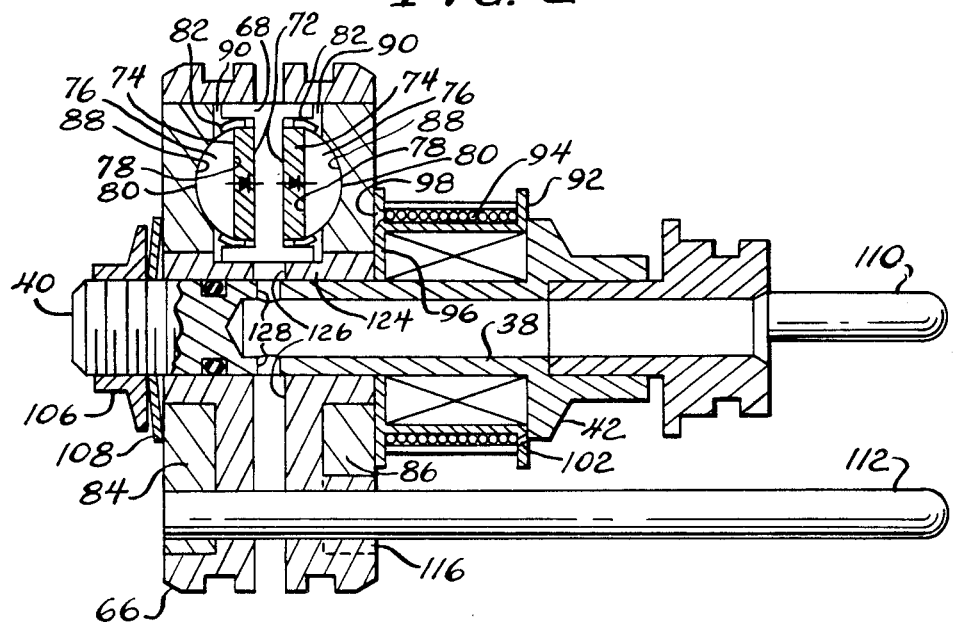
FIG. 2 is an enlarged sectional view of the rectifier assembly taken approximately along the line 2—2 in FIG. 3.
Figure 3:
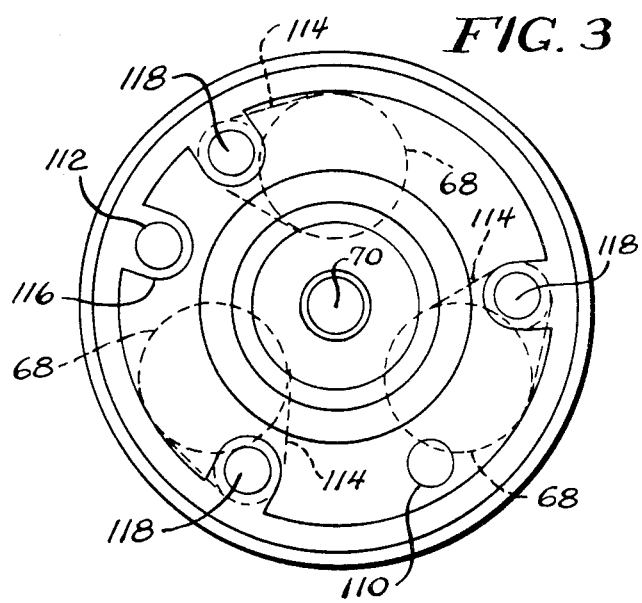
FIG. 3 is an end view of the rectifier assembly.

Turning now to FIGS. 2 and 3, the rectifier assembly is formed of an annular housing 66 formed of insulating material which is fitted appropriately about the shaft 38. Within the housing 66 are three phase conductors 68 which also serve as diode wafer receivers. As can be seen in FIG. 3, the phase conductors 68 are equally angularly spaced about the center line of the rotor as represented by a point 70. They are equally radially spaced from the point 70 as well.

Each phase conductor 68 is formed of electrically conductive material and has opposed, axially opening recesses 72 adapted to receive conventional diode wafers 74. The diode wafers may be disposed within the recesses in any desired polarity but for implementing the circuit illustrated in FIG. 4, they are inserted with the polarity illustrated in FIG. 2. Preferably, a layer of soft metal foil, e.g. silver foil, (not shown) is disposed between the bottom of each recess 72 and the abutting pole of the corresponding diode wafer 74 to assure good electrical contact.

Each recess 72 further receives a corresponding load shoe 76 formed of conductive material. As illustrated, each load shoe 76 has a first surface 78 in electrical contact with the pole of the diode wafer 74 opposite the pole in contact with the phase connector 68. Soft metal foil may also be employed at this interface to assure good electrical contact. The opposite surface 80 of the load shoe is configured as a portion of a sphere and extends out of the corresponding recess 72 as illustrated. To prevent shorting of the diode wafers 74 and abutting load shoes 76 against the phase conductor 68, and to aid in assembly of the diode wafers and associated load shoes 76 to the recesses 74, the junction of each diode wafer 74 and associated load shoe 76 may be peripherally wrapped with shrink tubing 82 of insulating material. The shrink tubing 82 also acts as a seal to prevent oil from contacting the diode junction.

Also disposed within the housing 66 is a pair of end conductors 84 and 86 which, as their name implies, are formed of conducting material. Each end conductor 84 is provided with a plurality of equally angularly spaced spherical recesses 88 located so as to receive the spherical surface 80 of the various abutting load shoes 76 and establish good electrical contact therewith. The end conductors 84 and 86 are somewhat axially movable within the housing 66 and thus, the recesses 88 have limited depth so that the end conductors 84 and 86 cannot contact the phase conductors 68. In short, when assembled, the arrangement is such that a space 90 exists between the end conductors 84 and 86 and the adjacent ends of the phase conductors 68.

The rectifier assembly includes, as mentioned previously, a load resistor 64. As seen in FIG. 2, the load resistor is in the form of a sleeve surrounding the shaft 38 and in fact is defined by a spool 92 of insulating material having resistive wire 94 wrapped about its periphery. At one side 96 of the spool, the wire emerges at 98 to be in electrical contact with the end conductor 86. At the opposite end the wire emerges at 102 to be in electrical contact with the shoulder 42 on the shaft 38.

A nut 106 of electrically conductive material is threaded on the threaded end 40 of the shaft 38 and is employed to preload a Belleville washer 108, also formed of conductive material against the end conductor 84. Thus, the Bellville washer 108, by mechanical contact with the end conductor 84, tends to bias the end conductors 84 and 86 towards each other; and moreover, biases the end conductor 86 into good electrical contact with the wire at point 98 of the load resistor 64 which in turn biases the wire at the point 102 into good electrical contact with the shoulder 42 on the shaft 38. By this arrangement, a number of advantages flow. Firstly, because of the equal angular and radial spacing of the phase conductors 68, a uniform preload serving to assure good electrical contact and minimize contact resistance is provided against all diode wafers 74. Secondly, the same biasing provides good electrical contact between the poles of the load resistor 64 and the remainder of the circuit eliminating the need for terminals to establish the connection thus minimizing both space and weight. Because of the use of curved or spherical surfaces on the load shoes 76 and in defining the recesses 80, self-alignment of the components and equal distribution of the biasing force is fostered and yet only the single biasing means in the form of the Belleville washer 108 is employed to provide good contact between various components involved with six diode wafers. The Belleville washer 108 also maintains an acceptable preload on the diode wafers 74 during axial movement of the rectifier assembly due to thermal expansion.

Of course, depending upon the actual use to which the rectifier assembly is to be put, greater or lesser numbers of diode wafers could be employed.

Each of the end conductors 84 and 86 may be provided with a jack-like connector for electrical connection to the field winding 20 of the rotor 12. One such connector is shown at 110 as being mounted to the end conductor 86 in FIG. 2. A second such connector is shown at 112 in and may extend through the various components including the end conductor 86 by means of aligned bores and suitable insulating means (not numbered) to provide the desired isolation.

Inputs to the junctions 58, 60 and 62 of the diodes 54 and 66 is simply accomplished by connections to each of the three phase connectors 68 employed in the assembly. As seen in FIGS. 2 and 3, each of the phase connectors 68 may have a generally radially extending tab 114 or the like suitably spaced from the adjacent end connectors 84 or 86. The end conductor 86 may be provided with suitable recesses in its periphery to define insulating sleeves such as shown at 116 integrally formed on the housing 66 and through which terminal pins 118 may pass for connection to respective ones of the tab 114 to establish the requisite electrical contact.

For cooling purposes, an interior portion 124 of the housing 66 may be provided with radial bores 126 in alignment with the centers of the phase conductors 68 as well as with radial bores 128 in the shaft 34 extending to the hollow center 44 thereof. Thus, cooling oil introduced into the shaft 38 may flow radially to the space between the end conductors 84 and 86 not occupied by the phase conductors 68 and about the load shoes as well as the phase conductors 68 to absorb heat generated during operation of the rectifier assembly.

From the foregoing, it will be appreciated that a rectifier assembly made according to the invention provides an extremely axially compact structure as well as one that is radially compact. The number of terminals in the assembly is minimized through the unique use of end conductors common to a plurality of diodes and the biasing system which operates, not only against the diode wafers, but against the load resistor 64 as well to provide electrical contact. Cooling of the components is easily satisifed by making use of voids in the assembly provided for electrical isolation as coolant passages. And importantly, a single biasing means is operative to assure good electrical connections between a large number of diodes in contrast to prior art systems utilizing one or more clamping devices for each diode, thereby effecting both weight and space savings.

I claim:
1. A rotating rectifier assembly comprising:
a shaft adapted to be rotated;
three, equally angularly spaced phase conductors disposed about said shaft and insulated with respect to each other and with respect to the shaft, each of said conductors having opposed, axially opening recesses on opposite sides thereof;
a plurality of diode wafers, one in each said recess;
a plurality of electrically conductive load shoes, one for each recess, each said load shoe having a first surface adapted to electrically mate with a side of a diode wafer in the corresponding recess and a second, opposite surface generally configured as a portion of a sphere and extending out of the associated recess;
a pair of axially spaced end conductors sandwiching said phase conductors, wafers and load shoes, each end conductor having three equally angularly spaced spherical recesses receiving and electrically contacting a corresponding one of said second surfaces;
means biasing said end conductor towards each other;
means associated with said phase conductors for electrically connecting each phase conductor to a respective phase of a 3-phase A.C. source; and
means electrically associated with each of said end conductors for providing a D.C. output to a point of use.

2. The rotating rectifier assembly of claim 1 wherein at least one of said end conductors is axially movable on said shaft and said biasing means is mounted on said shaft and in mechanical contact with said one end conductor.

3. The rotating rectifier assembly of claim 2 further including a load resistor mounted on said shaft and having one pole in electrical contact with the other of said end conductors and the other pole in electrical contact with said shaft, said shaft and said biasing means being electrically conductive and said biasing means further being in electrical contact with said one end conductor.

4. A rotating rectifier assembly comprising:
an electrically conductive shaft adapted to be rotated;
a plurality of diodes disposed about the shaft in insulated relation with respect thereto;
means mounting said diodes about said shaft to form a rectifier and including two axially spaced end conductors sandwiching said diodes;
electrically conductive means in electrical and mechanical contact with one of said end conductors and said shaft for biasing said end conductors towards each other to assure good electrical connections within said rectifier; and
an electrical load component carried by said shaft and having one pole in electrical contact with said shaft and another pole in electrical contact with the other of said end conductors.

5. The rotating rectifier assembly of claim 4 wherein said load component is configured as a sleeve and surrounds said shaft and wherein said shaft has a shoulder, said poles being at opposite ends of said sleeve, said sleeve extending between said shoulder and said other end conductor, said biasing means further biasing said other end conductor against said sleeve and said sleeve against said shoulder.

6. The rotating rectifier assembly of claim 5 wherein said electrical load component is a spool wound resistor defining said sleeve.

7. An axially compact rectifier assembly comprising:
a plurality of diode wafers;
a plurality of diode wafer receivers, one for each diode, each receiver having a recess in which a corresponding diode wafer is received; each recess having an electrically conductive bottom surface for electrical contact with a pole of the corresponding diode wafer;

a plurality of load shoes, one for each recess, each load shoe having a first surface for electrical contact within the corresponding recess with the opposite pole of the corresponding wafer, and a generally spherical second surface opposite said first surface and extending outside of the corresponding recess;

an end conductor having a plurality of generally spherical recesses, one for each load shoe, receiving the corresponding load shoe second surface; and a single means biasing said end conductor toward said diode wafer receivers.

8. The rectifier assembly of claim 7 wherein said diode wafer receivers are equally angularly and radially spaced about a single point and wherein the biasing force applied by said biasing means is effectively applied at said point.

9. A rectifier assembly comprising:

a diode wafer receiver of conductive material and having oppositely opening diode receiving recesses, the bottoms of said recesses being adapted to electrically contact a pole on a diode wafer received therein;

a diode wafer in each of said recesses;

an electrically conductive load shoe in each of said recesses, each load shoe having a first surface adapted to electrically contact the other pole of the diode wafer in which the load shoe is received and an opposite curved surface located at least partially out of the recess;

a pair of end conductors sandwiching said diode receiver, diode wafers and load shoes, each end conductor having a curved surface mating with the curved surface of the adjacent load shoe; and means biasing said end conductors towards each other.

10. A full wave rectifier assembly including the assembly of claim 9 wherein said poles of each diode wafer constitute an anode and a cathode, one of said diode wafers having its anode in electrical contact with the bottom of the recess in which it is received, the other of said diode wafers having its cathode in electrical contact with the bottom of the recess in which it is received.

11. A rectifier assembly including a plurality of the diode wafer receivers, and a number of the diode wafers and load shoes of claim 10 and corresponding to the number of the recesses in the diode wafer receivers, each said end conductor having a number of said curved surfaces corresponding to the number of adjacent load shoes.

* * * * *